(12) United States Patent
Dent et al.

(10) Patent No.: US 9,902,811 B2
(45) Date of Patent: Feb. 27, 2018

(54) CURABLE SILICONE COMPOSITION, CURED PRODUCT THEREOF, AND OPTICAL SEMICONDUCTOR DEVICE

(71) Applicants: Dow Corning Toray Co., Ltd., Tokyo (JP); Dow Corning Corporation, Midland, MI (US)

(72) Inventors: Stanton James Dent, Midland, MI (US); Tomohiro Iimura, Ichihara (JP); Yusuke Miyamoto, Tokyo (JP); Yoshitsugu Morita, Ichihara (JP); Fumito Nishida, Midland, MI (US); Emil Radkov, Midland, MI (US); Jacob William Steinbrecher, Midland, MI (US); Hiroaki Yoshida, Ichihara (JP); Makoto Yoshitake, Ichihara (JP)

(73) Assignees: DOW CORNING TORAY CO. LTD., Chiyoda-ku, Tokyo (JP); DOW CORNING CORPORATION, Midland, MI (US)

( * ) Notice: Subject to any disclaimer, the term of this patent is extended or adjusted under 35 U.S.C. 154(b) by 0 days.

(21) Appl. No.: 14/769,131

(22) PCT Filed: Feb. 21, 2014

(86) PCT No.: PCT/US2014/017623
§ 371 (c)(1),
(2) Date: Aug. 20, 2015

(87) PCT Pub. No.: WO2014/130784
PCT Pub. Date: Aug. 28, 2014

(65) Prior Publication Data
US 2015/0376344 A1 Dec. 31, 2015

Related U.S. Application Data

(60) Provisional application No. 61/767,972, filed on Feb. 22, 2013.

(51) Int. Cl.
C08G 77/398 (2006.01)
C08G 77/08 (2006.01)
(Continued)

(52) U.S. Cl.
CPC .............. *C08G 77/08* (2013.01); *C08L 83/14* (2013.01); *C09K 11/025* (2013.01);
(Continued)

(58) Field of Classification Search
None
See application file for complete search history.

(56) References Cited

U.S. PATENT DOCUMENTS 3,267,036 A * 8/1966 Baker ................... C08G 77/398
508/201
3,884,950 A * 5/1975 Koda ................... C08G 77/398
508/213
(Continued)

FOREIGN PATENT DOCUMENTS

CN 101899214 A 12/2010
JP S 49-083744 A 8/1974
(Continued)

OTHER PUBLICATIONS

International Search Report for Application No. PCT/US2014/017623 dated Apr. 8, 2014, 4 pages.
(Continued)

*Primary Examiner* — Robert S Loewe
(74) *Attorney, Agent, or Firm* — Howard & Howard Attorneys PLLC

(57) ABSTRACT

This invention relates to a curable silicone composition comprising: (A) a straight-chain organopolysiloxane having at least two alkenyl groups in a molecule; (B) an organopolysiloxane represented by the following average unit formula: $(R^1SiO_{3/2})_a(R^1{}_2SiO_{2/2})_b(R^1{}_3SiO_{1/2})_c(SiO_{4/2})_d$
(Continued)

$(XO_{1/2})_e$ wherein, $R^1$ each independently represent an alkyl group having from 1 to 12 carbons, an alkenyl group having from 2 to 12 carbons, an aryl group having from 6 to 20 carbons, an aralkyl group having from 7 to 20 carbons, or a group in which some or all of the hydrogen atoms of these groups are substituted with halogen atoms, with the proviso that at least two $R^1$ in a molecule are the alkenyl groups, X is a hydrogen atom or an alkyl group, a is a number from 0 to 0.3, b is 0 or a positive number, c is a positive number, d is a positive number, e is a number from 0 to 0.4, a+b+c+d=1, c/d is a number from 0 to 10, and b/d is a number from 0 to 0.5; (C) an organopolysiloxane having at least two silicon-bonded hydrogen atoms in a molecule; (D) a cerium-containing organopolysiloxane; and (E) a hydrosilylation reaction catalyst. The curable silicone composition does not develop cracks due to thermal aging and can form a cured product having little yellow discoloration.

17 Claims, 3 Drawing Sheets

(51) Int. Cl.

| | | |
|---|---|---|
| *C08L 83/14* | (2006.01) | |
| *C09K 11/02* | (2006.01) | |
| *C09K 11/77* | (2006.01) | |
| *H01L 33/50* | (2010.01) | |
| *C08G 77/58* | (2006.01) | |
| *C08G 77/12* | (2006.01) | |
| *C08G 77/20* | (2006.01) | |

(52) U.S. Cl.
CPC .......... *C09K 11/7706* (2013.01); *H01L 33/50* (2013.01); *C08G 77/12* (2013.01); *C08G 77/20* (2013.01); *C08G 77/398* (2013.01); *C08G 77/58* (2013.01); *C08G 2190/00* (2013.01); *H01L 2224/45144* (2013.01); *H01L 2224/48091* (2013.01); *H01L 2224/48247* (2013.01); *H01L 2924/181* (2013.01)

(56) References Cited

U.S. PATENT DOCUMENTS

| RE28,938 E | * | 8/1976 | Koda | C08K 5/5406 |
|---|---|---|---|---|
| | | | | 508/201 |
| 4,070,343 A | * | 1/1978 | Kishimoto | C08L 83/14 |
| | | | | 508/201 |
| 4,560,784 A | * | 12/1985 | Mori | C08G 77/398 |
| | | | | 556/401 |
| 4,948,826 A | * | 8/1990 | Hirai | C08K 5/5406 |
| | | | | 524/306 |
| 5,708,067 A | | 1/1998 | Akamatsu et al. | |
| 8,389,650 B2 | | 3/2013 | Takanashi et al. | |
| 9,164,197 B2 | * | 10/2015 | Takahashi | C08K 5/098 |
| 2006/0073347 A1 | * | 4/2006 | Morita | C08L 83/04 |
| | | | | 428/447 |
| 2008/0255304 A1 | * | 10/2008 | Nakashima | C08L 83/04 |
| | | | | 525/100 |
| 2008/0255321 A1 | * | 10/2008 | Nakashima | B32B 25/20 |
| | | | | 525/476 |
| 2011/0077344 A1 | * | 3/2011 | Hasegawa | C08L 83/04 |
| | | | | 524/500 |
| 2011/0215707 A1 | | 9/2011 | Brunt, Jr. et al. | |
| 2013/0161686 A1 | * | 6/2013 | Yoshitake | H01L 24/29 |
| | | | | 257/100 |
| 2014/0235806 A1 | * | 8/2014 | Miyamoto | C08L 83/04 |
| | | | | 526/126 |

FOREIGN PATENT DOCUMENTS

| JP | S 51-041046 A | 10/1974 |
|---|---|---|
| JP | H 10-231428 A | 9/1998 |
| JP | 2006-335857 A | 12/2006 |
| JP | 2008-291148 A | 12/2008 |
| WO | WO 2008/047892 A1 | 4/2008 |

OTHER PUBLICATIONS

Thomson Scientific, London, GB "Database WPI, Week 200882", An 2008-011866; XP-002722019, Dec. 4, 2008, 2 pages.
Thomson Scientific, London, GB, "Database WPI, Week 201128", AN 2011-A34563; XP-002722020, Dec. 1, 2010, 2 pages.
English language abstract and machine-assisted English translation for CN 101899214 extracted from espacenet.com database on Aug. 26, 2015, 11 pages.
English language abstract not found for JPS 49-083744; however, see English language equivalent U.S. Pat. No. 3,884,950 Original document extracted from espacenet.com database on Aug. 26, 2015, 5 pages.
Partial English language translation for JPS 51-041046 provided by Shiga International Patent Office on Aug. 19, 2015, 2 pages.
English language abstract and machine-assisted English translation for JPH 10-231428 extracted from espacenet.com database on Aug. 26, 2015, 17 pages.
English language abstract and machine-assisted English translation for JP 2006-335857 extracted from the PAJ database on Aug. 26, 2015, 16 pages.
English language abstract and machine-assisted English translation for JP 2008-291148 extracted from espacenet.com database on Aug. 26, 2015, 24 pages.
English language abstract for WO 2008/047892 extracted from espacenet.com database on Aug. 26, 2015, 2 pages.

* cited by examiner

[FIG. 1]
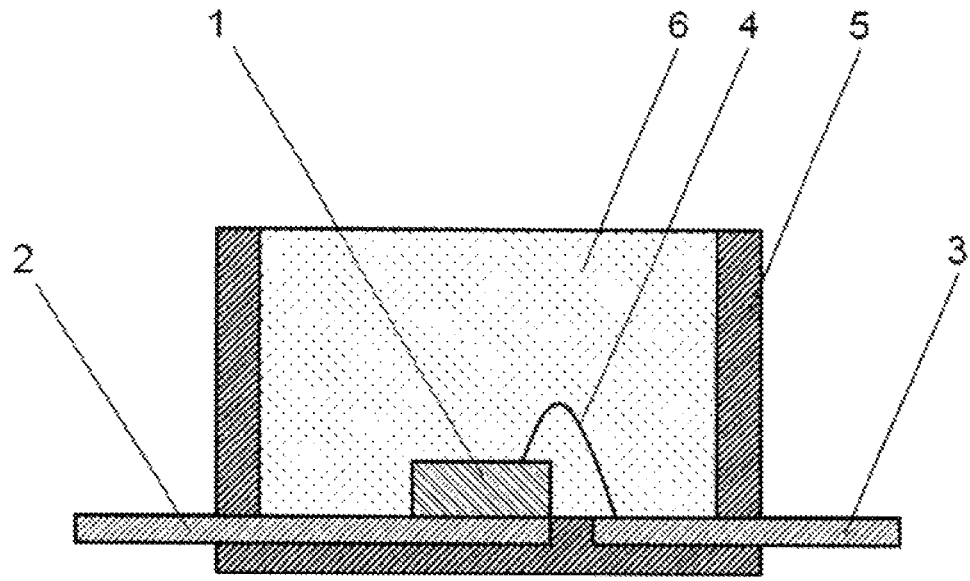
[FIG. 2]
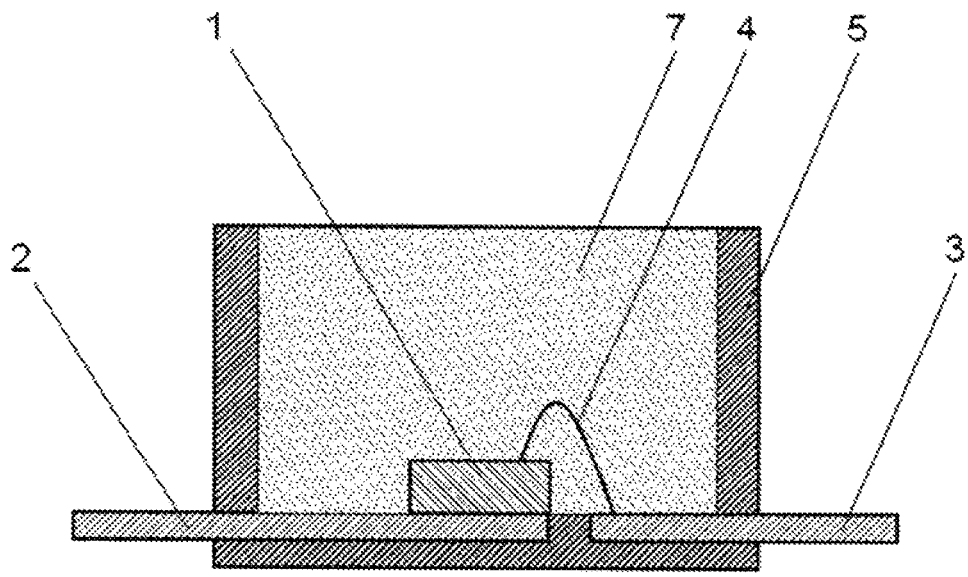

[FIG. 3]
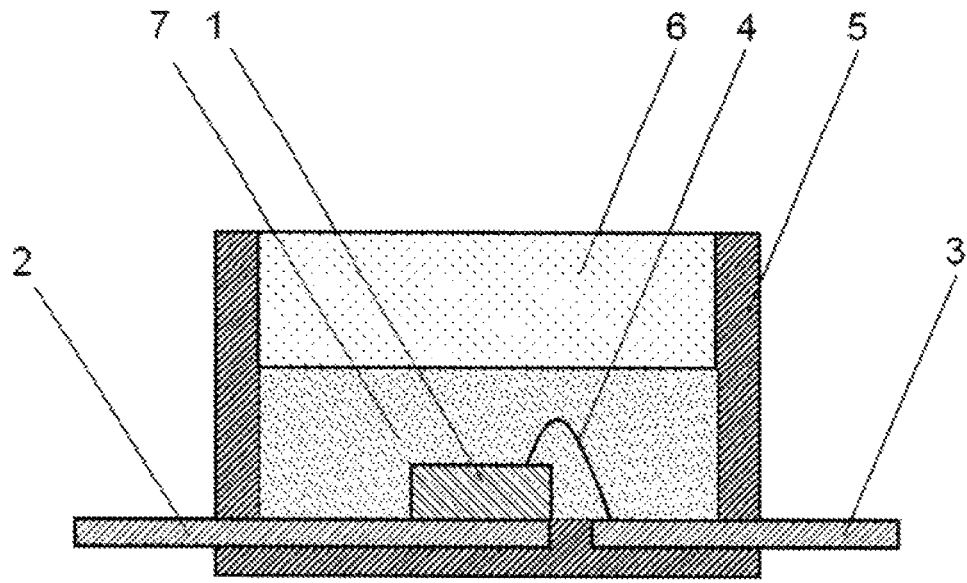
[FIG. 4]
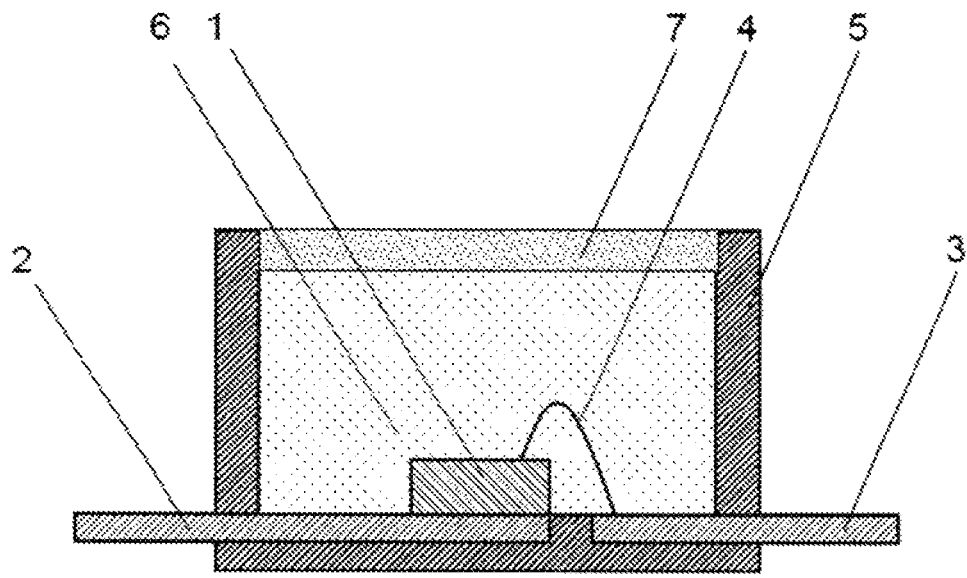

[FIG. 5]
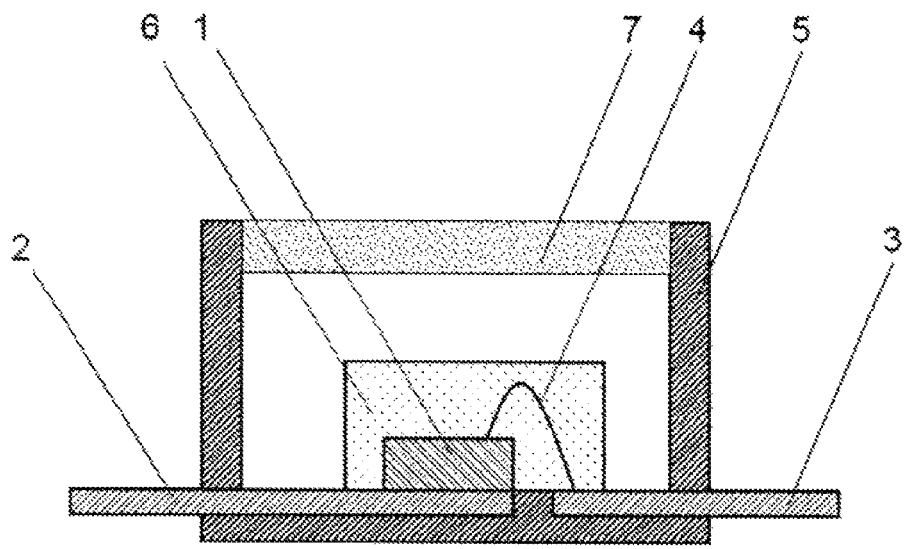
[FIG. 6]
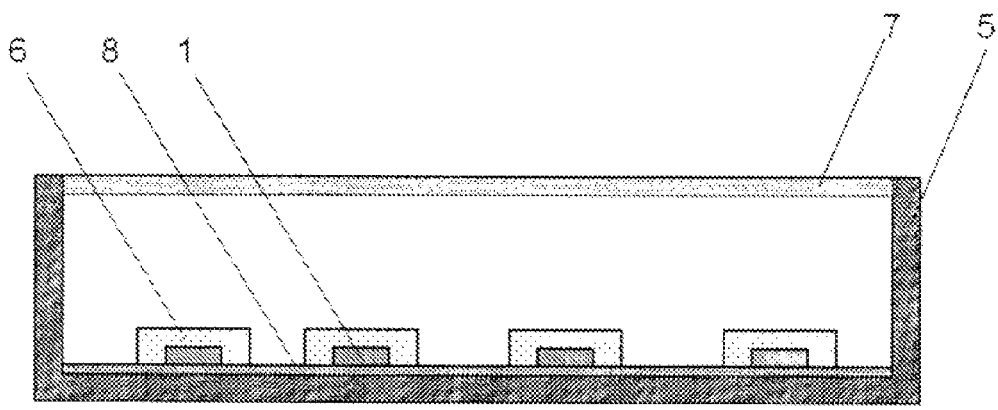
[FIG. 7]
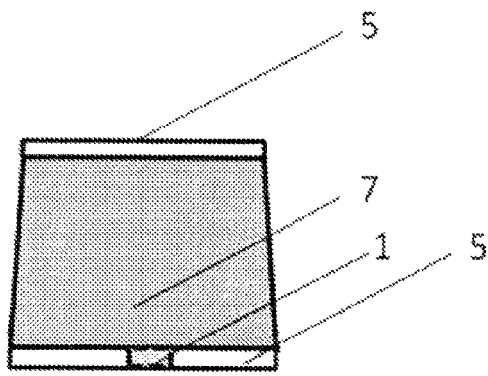

//CURABLE SILICONE COMPOSITION, CURED PRODUCT THEREOF, AND OPTICAL SEMICONDUCTOR DEVICE

RELATED APPLICATIONS

This application is the National Stage of International Patent Application No. PCT/US2014/017623, filed on Feb. 21, 2014, which claims priority to and all the advantages of U.S. Patent Application No. 61/767,972, filed on Feb. 22, 2013, the content of which is incorporated herein by reference.

TECHNICAL FIELD

The present invention relates to a curable silicone composition, a cured product thereof, and an optical semiconductor device produced using the composition.

BACKGROUND ART

Curable silicone compositions which cure in response to a hydrosilylation reaction are used for various applications since the compositions form cured products with excellent rubber-like properties such as hardness and elongation. Examples of known compositions include a curable silicone composition comprising: a straight-chain organopolysiloxane having at least two alkenyl groups in a molecule; an organopolysiloxane consisting of $SiO_{4/2}$ units, $ViR_2SiO_{1/2}$ units, and $R_3SiO_{1/2}$ units (wherein, Vi is a vinyl group, and R are substituted or unsubstituted monovalent hydrocarbon groups which do not contain unsaturated aliphatic bonds); an organopolysiloxane having at least one silicon-bonded alkoxy group and at least two silicon-bonded hydrogen atoms in a molecule; and a platinum metal-type catalyst (see Patent Document 1); and a curable silicone composition comprising: a straight-chain organopolysiloxane having at least two alkenyl groups in a molecule; an organopolysiloxane consisting of $SiO_{4/2}$ units and $R'(CH_3)_2SiO_{1/2}$ units (wherein, R' is an alkenyl group or a methyl group) and having at least three alkenyl groups in a molecule; an organopolysiloxane consisting of $SiO_{4/2}$ units and $R''(CH_3)_2SiO_{1/2}$ units (wherein, R'' is a hydrogen atom or a methyl group) and having at least three silicon-bonded hydrogen atoms in a molecule; and a platinum metal compound (see Patent Documents 2 and 3).

Such a curable silicone composition forms a transparent cured product without generating byproducts and is therefore suitable as a sealing agent for an optical semiconductor device. However, when used for a long period of time in an environment at 200° C. or higher, cracks form in the cured product, which leads to the problem of diminished adhesion with the substrate, diminished sealing performance, and diminished transparency.

On the other hand, adding a cerium-containing organopolysiloxane is a well-known method of improving the heat resistance of a curable silicone composition (for example, see Patent Documents 4 and 5). However, since cerium-containing organopolysiloxanes give off a yellow color, they have not been used in curable silicone compositions for optical semiconductor devices requiring transparency.

PRIOR ART DOCUMENTS

Patent Documents

Patent Document 1: Japanese Unexamined Patent Application Publication No. H10-231428
Patent Document 2: Japanese Unexamined Patent Application Publication No. 2006-335857
Patent Document 3: WO2008/047892 pamphlet
Patent Document 4: Japanese Unexamined Patent Application Publication No. S49-083744
Patent Document 5: Japanese Unexamined Patent Application Publication No. S51-041046

SUMMARY OF INVENTION

Technical Problem

An object of the present invention is to provide a curable silicone composition which does not develop cracks due to thermal aging and can form a cured product having little yellow discoloration. Another object of the present invention is to provide a cured product which does not develop cracks due to thermal aging and has little yellow discoloration, and to provide an optical semiconductor device with excellent reliability.

Solution to Problem

The curable silicone composition of the present invention comprises:
(A) a straight-chain organopolysiloxane having at least two alkenyl groups in a molecule;
(B) an organopolysiloxane represented by the following average unit formula:

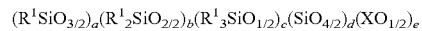

wherein, $R^1$ each independently represent an alkyl group having from 1 to 12 carbon atoms, an alkenyl group having from 2 to 12 carbon atoms, an aryl group having from 6 to 20 carbon atoms, an aralkyl group having from 7 to 20 carbon atoms, or a group in which some or all of the hydrogen atoms of these groups are substituted with halogen atoms, with the proviso that at least two $R^1$ in a molecule are the alkenyl groups, X is a hydrogen atom or an alkyl group, a is a number from 0 to 0.3, b is 0 or a positive number, c is a positive number, d is a positive number, e is a number from 0 to 0.4, a+b+c+d=1, c/d is a number from 0 to 10, and b/d is a number from 0 to 0.5, in an amount such that the mass ratio of component (A) to component (B) is from 1/99 to 99/1;
(C) an organopolysiloxane having at least two silicon-bonded hydrogen atoms in a molecule, in an amount such that the amount of silicon-bonded hydrogen atoms in component (C) is from 0.1 to 10 moles per 1 mole of the total alkenyl groups in components (A) and (B);
(D) a cerium-containing organopolysiloxane, in an amount such that the amount of cerium atoms in component (D) is from 20 to 2,000 ppm in terms of mass units with respect to the total mass of the composition; and
(E) a catalytic quantity of a hydrosilylation reaction catalyst.
It is preferable for from 0.1 to 40 mol % of all $R^1$ in component (B) to be alkenyl groups having from 2 to 12 carbon atoms and for at least 10 mol % of all $R^1$ to be alkyl groups having from 1 to 12 carbon atoms.
Further, component (B) is preferably an organopolysiloxane comprising: $R^1(CH_3)_2SiO_{1/2}$ units (wherein, $R^1$ is an alkyl group having from 1 to 12 carbon atoms, an alkenyl group having from 2 to 12 carbon atoms, an aryl group having from 6 to 20 carbon atoms, an aralkyl group having from 7 to 20 carbon atoms, or a group in which some or all of the hydrogen atoms of these groups are replaced with halogen atoms, with the proviso that at least two $R^1$ in a molecule are the alkenyl groups) and $SiO_{4/2}$ units.
The curable silicone composition of the present invention may further comprise (F) a hydrosilylation reaction inhibitor in an amount equal to 0.01 to 3 parts by mass per 100 parts by mass of the total mass of components (A) to (D).

The curable silicone composition of the present invention may further comprise (G) an adhesion promoter in an amount equal to 0.1 to 3 parts by mass per 100 parts by mass of the total mass of components (A) to (D).

The curable silicone composition of the present invention may further comprise (H) a phosphor in an amount equal to 0.1 to 70% by mass with respect to the total mass of the composition.

Further, the curable silicone composition of the present invention can from a cured product with an optical transmittance at 450 nm of at least 90%.

Further, the curable silicone composition of the present invention can form a cured product with a value of b* of not more than 2.0 in the CIE L*a*b* color system prescribed by JIS Z8730 before or after heating for 500 hours at 240° C.

The cured product of the present invention is formed by curing the curable silicone composition. Further, the cured product may be in the form of a lens, a light pipe, a light guide, or a remote phosphor component.

Further, the optical semiconductor device of the present invention is formed by sealing, covering, or adhering an optical semiconductor element in a semiconductor device with the curable silicone composition.

The optical semiconductor element may be a light-emitting diode.

Advantageous Effects of Invention

The curable silicone composition of the present invention does not develop cracks due to thermal aging and can form a cured product having little yellow discoloration. In addition, the cured product of the present invention does not develop cracks due to thermal aging and has little yellow discoloration. The cured product of the present invention has an unexpected benefit of increased flame resistance. Furthermore, the optical semiconductor device of the present invention exhibits excellent reliability.

BRIEF DESCRIPTION OF THE DRAWINGS

FIG. 1 is a cross-sectional view of an LED that is an example of an optical semiconductor device of the present invention.

FIG. 2 is a cross-sectional view of an LED that is an example of the optical semiconductor device of the present invention.

FIG. 3 is a cross-sectional view of an LED that is an example of the optical semiconductor device of the present invention.

FIG. 4 is a cross-sectional view of an LED that is an example of the optical semiconductor device of the present invention.

FIG. 5 is a cross-sectional view of an LED using a phosphor-containing cured product of the present invention as a remote phosphor.

FIG. 6 is a cross-sectional view of an illumination device using a phosphor-containing cured product of the present invention as a remote phosphor.

FIG. 7 is a cross-sectional view of an LED using a phosphor-containing cured product of the present invention.

DESCRIPTION OF EMBODIMENTS

[Curable Silicone Composition]

First, the curable silicone composition of the present invention will be described in detail.

Component (A) is a straight-chain organopolysiloxane having at least two alkenyl groups in a molecule. The molecular structure of component (A) is a straight-chain structure, but part of the molecular chain may be branched as long as the object of the present invention is not undermined.

Examples of the alkenyl groups in component (A) include alkenyl groups having from 2 to 12 carbon atoms such as vinyl groups, allyl groups, butenyl groups, pentenyl groups, hexenyl groups, heptenyl groups, octenyl groups, nonenyl groups, decenyl groups, undecenyl groups, and dodecenyl groups, and vinyl groups are preferable. Examples of groups bonding to silicon atoms other than alkenyl groups in component (A) include alkyl groups having from 1 to 12 carbon atoms such as methyl groups, ethyl groups, propyl groups, isopropyl groups, n-butyl groups, isobutyl groups, tert-butyl groups, n-pentyl groups, neopentyl groups, hexyl groups, cyclohexyl groups, heptyl groups, octyl groups, nonyl groups, decyl groups, undecyl groups, and dodecyl groups; aryl groups having from 6 to 20 carbon atoms such as phenyl groups, tolyl groups, xylyl groups, and naphthyl groups; aralkyl groups having from 7 to 20 carbon atoms such as benzyl groups, phenethyl groups, and phenyl propyl groups; and groups in which some or all of the hydrogen atoms of these groups are substituted with halogen atoms such as fluorine atoms, chlorine atoms, or bromine atoms. The silicon atoms in component (A) may also have small quantities of hydroxyl groups or alkoxy groups such as methoxy groups and ethoxy groups within a range that does not undermine the object of the present invention.

The viscosity of component (A) is not particularly limited, but is preferably within the range of from 10 to 100,000 mPa·s and more preferably within the range of from 50 to 50,000 mPa·s at 25° C. This is because the mechanical characteristics of the resulting cured product are favorable when the viscosity of component (A) is greater than or equal to the lower limit of the range described above, and the handling workability of the resulting composition is favorable when the viscosity is less than or equal to the upper limit of the range described above.

Examples of such component (A) include dimethylpolysiloxanes capped at both molecular terminals with dimethylvinylsiloxy groups, dimethylpolysiloxanes capped at both molecular terminals with diphenylvinylsiloxy groups, dimethylsiloxane-methylphenylsiloxane copolymers capped at both molecular terminals with dimethylvinylsiloxy groups, dimethylsiloxane-diphenylsiloxane copolymers capped at both molecular terminals with dimethylvinylsiloxy groups, dimethylsiloxane-methylphenylsiloxane copolymers capped at both molecular terminals with diphenylvinylsiloxy groups, dimethylsiloxane-methylvinylsiloxane copolymers capped at both molecular terminals with dimethylvinylsiloxy groups, dimethylsiloxane-methylphenylsiloxane-methylvinylsiloxane copolymers capped at both molecular terminals with dimethylvinylsiloxy groups, dimethylsiloxane-diphenylsiloxane-methylvinylsiloxane copolymers capped at both molecular terminals with dimethylvinylsiloxy groups, methylvinylpolysiloxanes capped at both molecular terminals with trimethylsiloxy groups, methylvinylsiloxane-methylphenylsiloxane copolymers capped at both molecular terminals with trimethylsiloxy groups, methylvinylsiloxane-diphenylsiloxane copolymers capped at both molecular terminals with trimethylsiloxy groups, and dimethylsiloxane-methylvinylsiloxane copolymers capped at both molecular terminals with trimethylsiloxy groups.

Component (B) is an organopolysiloxane represented by the following average unit formula:

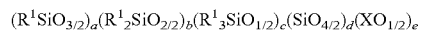

$(R^1SiO_{3/2})_a(R^1{}_2SiO_{2/2})_b(R^1{}_3SiO_{1/2})_c(SiO_{4/2})_d(XO_{1/2})_e$

In the formula, $R^1$ each independently represent an alkyl group having from 1 to 12 carbon atoms, an alkenyl group having from 2 to 12 carbon atoms, an aryl group having from 6 to 20 carbon atoms, an aralkyl group having from 7 to 20 carbon atoms, or a group in which some or all of the hydrogen atoms of these groups are substituted with halogen atoms. Examples of the alkyl groups for $R^1$ include methyl groups, ethyl groups, propyl groups, isopropyl groups, n-butyl groups, isobutyl groups, tert-butyl groups, n-pentyl groups, neopentyl groups, hexyl groups, cyclohexyl groups, heptyl groups, octyl groups, nonyl groups, decyl groups, undecyl groups, and dodecyl groups. Examples of the alkenyl groups for $R^1$ include vinyl groups, allyl groups, butenyl groups, pentenyl groups, hexenyl groups, heptenyl groups, octenyl groups, nonenyl groups, decenyl groups, undecenyl groups, and dodecenyl groups. Examples of the aryl groups for $R^1$ include phenyl groups, tolyl groups, xylyl groups, and naphthyl groups. Examples of the aralkyl groups for $R^1$ include benzyl groups, phenethyl groups, and phenyl propyl groups. Examples of the halogen-substituted groups for $R^1$ include 3-chloropropyl groups and 3,3,3-trifluoropropyl groups. However, in component (B), at least two $R^1$ in a molecule are the alkenyl groups and are preferably vinyl groups. It is preferable for 0.1 to 40 mol % of all $R^1$ in a molecule to be the alkenyl groups. This is because the reactivity with component (C) improves when the content of alkenyl groups is greater than or equal to the lower limit of the range described above, and the reactivity with component (C) improves when the content is less than or equal to the upper limit of the range described above. In a cured product obtained by curing the present composition, at least 10 mol % of all $R^1$ are preferably the alkyl groups and particularly preferably methyl groups in a molecule due to the small amount of attenuation due to light refraction, reflection, scattering, or the like.

In the formula, X is a hydrogen atom or an alkyl group. The alkyl group for X is preferably an alkyl group having from 1 to 3 carbons, and specific examples include methyl groups, ethyl groups, and propyl groups.

In the formula, a is a number from 0 to 0.3, b is 0 or a positive number, c is a positive number, d is a positive number, e is a number from 0 to 0.4, a+b+c+d=1, c/d is a number from 0 to 10, and b/d is a number from 0 to 0.5.

The molecular weight of such component (B) is not particularly limited, but the mass average molecular weight (Mw) in terms of standard polystyrene is preferably within the range of from 500 to 100,000 and particularly preferably within the range of from 1,000 to 30,000.

Such component (B) is preferably an organopolysiloxane comprising: $R^1(CH_3)_2SiO_{1/2}$ units and $SiO_{4/2}$ units. Component (B) may also comprise: $R^1SiO_{3/2}$ units or $R^1(CH_3)SiO_{2/2}$ units within a range that does not undermine the object of the present invention.

In component (B), the ratio of the $R^1(CH_3)_2SiO_{1/2}$ unit and the $SiO_{4/2}$ unit is not particularly limited, but the ratio of the $R^1(CH_3)_2SiO_{1/2}$ unit to the $SiO_{4/2}$ unit is preferably within the range of from 0.5 to 3 and even more preferably within the range of from 0.8 to 2. This is because the mechanical characteristics of the resulting cured product are favorable when the ratio of the $R^1(CH_3)_2SiO_{1/2}$ unit to the $SiO_{4/2}$ unit is greater than or equal to the lower limit of the range described above, and the compatibility with component (A) improves when the ratio is less than or equal to the upper limit of the range described above.

The content of component (B) is at an amount where the mass ratio with respect to component (A) is within the range of from 1/99 to 99/1 and preferably within the range of from 1/9 to 9/1. This is because the mechanical characteristics of the resulting cured product are favorable when the content of component (B) is greater than or equal to the lower limit of the range described above, and the handling workability of the resulting composition is favorable when the content is less than or equal to the upper limit of the range described above.

Component (C) is an organopolysiloxane having at least two silicon-bonded hydrogen atoms in a molecule. The molecular structure of component (C) is not particularly limited and may be, for example, straight chain, straight chain having some branches, branched chain, dendritic, or cyclic.

Examples of groups bonding to silicon atoms other than hydrogen atoms in component (C) include alkyl groups having from 1 to 12 carbon atoms such as methyl groups, ethyl groups, propyl groups, isopropyl groups, n-butyl groups, isobutyl groups, tert-butyl groups, n-pentyl groups, neopentyl groups, hexyl groups, cyclohexyl groups, heptyl groups, octyl groups, nonyl groups, decyl groups, undecyl groups, and dodecyl groups; aryl groups having from 6 to 20 carbon atoms such as phenyl groups, tolyl groups, xylyl groups, and naphthyl groups; aralkyl groups having from 7 to 20 carbon atoms such as benzyl groups, phenethyl groups, and phenyl propyl groups; and groups in which some or all of the hydrogen atoms of these groups are substituted with halogen atoms such as fluorine atoms, chlorine atoms, or bromine atoms. The silicon atoms in component (C) may also have small quantities of hydroxyl groups or alkoxy groups such as methoxy groups and ethoxy groups within a range that does not undermine the object of the present invention.

The viscosity of component (C) is not particularly limited, but is preferably in a range of from 1 to 10,000 mPa·s, and more preferably the viscosity is in a range of from 5 to 1,000 mPa·s at 25° C. This is because the mechanical characteristics of the resulting cured product are favorable when the viscosity of component (C) is greater than or equal to the lower limit of the range described above, and the handling workability of the resulting composition is favorable when the viscosity is less than or equal to the upper limit of the range described above.

Examples of such component (C) include dimethylpolysiloxanes capped at both molecular terminals with dimethylhydrogensiloxy groups, dimethylsiloxane-methylphenylsiloxane copolymers capped at both molecular terminals with dimethylhydrogensiloxy groups, dimethylsiloxane-methylhydrogensiloxane copolymers capped at both molecular terminals with dimethylhydrogensiloxy groups, methylhydrogenpolysiloxanes capped at both molecular terminals with trimethylsiloxy groups, dimethylsiloxane-methylhydrogensiloxane copolymers capped at both molecular terminals with trimethylsiloxy groups, organopolysiloxanes consisting of $H(CH_3)_2SiO_{1/2}$ units and $SiO_{4/2}$ units, and organopolysiloxanes consisting of $H(CH_3)_2SiO_{1/2}$ units, $(CH_3)_3SiO_{1/2}$ units, and $SiO_{4/2}$ units.

The content of component (C) is an amount such that the silicon-bonded hydrogen atoms in this component are within the range of from 0.1 to 10 moles and preferably within the range of from 0.5 to 5 moles with respect to 1 mole of the total alkenyl groups in components (A) and (B). This is because the resulting composition is sufficiently cured when the content of component (C) is greater than or equal to the lower limit of the range described above, and the heat resistance of the resulting cured product improves when the content is less than or equal to the upper limit of the range described above.

The cerium-containing organopolysiloxane for component (D) is a component for suppressing cracks due to thermal aging in a cured product obtained by curing the present composition. Such component (D) is prepared by means of a reaction with cerium chloride or a cerium salt of carboxylic acid and an alkali metal salt of a silanol-containing organopolysiloxane, for example.

Examples of cerium salts of carboxylic acid described above include cerium 2-ethylhexanoate, cerium naphthenate, cerium oleate, cerium laurate, and cerium stearate.

Examples of alkali metal salts of the silanol-containing organopolysiloxane described above include potassium salts of diorganopolysiloxanes capped at both molecular terminals with silanol groups, sodium salts of diorganopolysiloxanes capped at both molecular terminals with silanol groups, potassium salts of diorganopolysiloxanes capped at one molecular terminal with a silanol group and capped at the other molecular terminal with a triorganosiloxy group, and sodium salts of diorganopolysiloxanes capped at one molecular terminal with a silanol group and capped at the other molecular terminal with a triorganosiloxy group. Examples of groups bonding with the silicon atoms in the organopolysiloxane include alkyl groups having from 1 to 12 carbon atoms such as methyl groups, ethyl groups, propyl groups, isopropyl groups, n-butyl groups, isobutyl groups, tert-butyl groups, n-pentyl groups, neopentyl groups, hexyl groups, cyclohexyl groups, heptyl groups, octyl groups, nonyl groups, decyl groups, undecyl groups, and dodecyl groups; aryl groups having from 6 to 20 carbon atoms such as phenyl groups, tolyl groups, xylyl groups, and naphthyl groups; aralkyl groups having from 7 to 20 carbon atoms such as benzyl groups, phenethyl groups, and phenyl propyl groups; and groups in which some or all of the hydrogen atoms of these groups are substituted with halogen atoms such as fluorine atoms, chlorine atoms, or bromine atoms.

The reaction described above is performed at room temperature or by heating in an alcohol such as methanol, ethanol, isopropanol, or butanol; an aromatic hydrocarbon such as toluene or xylene; an aliphatic hydrocarbon such as hexane or heptane; and an organic solvent such as mineral spirit, ligroin, or petroleum ether. It is preferable to distill off the organic solvent or low-boiling point components or to filter any sediment from the resulting reaction product as necessary. In order to accelerate this reaction, dialkylformamide, hexaalkylphosphamide, or the like may be added. The content of cerium atoms in the cerium-containing organopolysiloxane prepared in this way is preferably within the range of from 0.1 to 5% by mass.

The content of component (D) in the present composition is an amount such that the cerium atoms are within the range of from 20 to 2,000 ppm in terms of mass units, preferably within the range of from 20 to 1,500 ppm, more preferably within the range of from 20 to 1,000 ppm, even more preferably within the range of from 20 to 500 ppm, and particularly preferably within the range of from 20 to 200 ppm. This is because the heat resistance of the resulting composition can be improved when the content of component (D) is greater than or equal to the lower limit of the range described above, and changes in luminescent chromaticity can be reduced when used in an optical semiconductor device when the content is less than or equal to the upper limit of the range described above.

Component (E) is a hydrosilylation reaction catalyst used to accelerate the hydrosilylation reaction of the present composition. Such component (E) is preferably a platinum element catalyst or a platinum element compound catalyst, and examples include platinum-based catalysts, rhodium-based catalysts, and palladium-based catalysts. Platinum-based catalysts are particularly preferable since the hydrosilylation reaction can be accelerated dramatically. Examples of such platinum-based catalysts include platinum fine powders, platinum black, chloroplatinic acid, alcohol-modified products of chloroplatinic acid, complexes of chloroplatinic acid and diolefin, platinum-olefin complexes, platinum-carbonyl complexes such as platinum bis-(acetoacetate) and platinum bis-(acetylacetonate), chloroplatinic acid-alkenylsiloxane complexes such as chloroplatinic acid-divinyltetramethyldisiloxane complexes and chloroplatinic acid-tetravinyltetramethylcyclotetrasiloxane complexes, platinum-alkenylsiloxane complexes such as platinum-divinyltetramethyldisiloxane complexes and platinum-tetravinyltetramethylcyclotetrasiloxane complexes, and complexes of chloroplatinic acid and acetylene alcohols. Platinum-alkenylsiloxane complexes are particularly preferable due to their excellent effect of accelerating hydrosilylation reactions. One type of these hydrosilylation reaction catalysts may be used alone, or two or more types may be used in combination.

The alkenylsiloxane used in the platinum-alkenylsiloxane complex is not particularly limited, and examples include 1,3-divinyl-1,1,3,3-tetramethyldisiloxane, 1,3,5,7-tetramethyl-1,3,5,7-tetravinylcyclotetrasiloxane, alkenylsiloxane oligomers in which some of the methyl groups of these alkenylsiloxanes are substituted with ethyl groups, phenyl groups, or the like, and alkenylsiloxane oligomers in which the vinyl groups of these alkenylsiloxanes are substituted with allyl groups, hexenyl groups, or the like. In particular, 1,3-divinyl-1,1,3,3-tetramethyldisiloxane is preferable due to the favorable stability of the platinum-alkenylsiloxane complex that is produced.

In order to improve the stability of the platinum-alkenylsiloxane complexes, it is preferable to dissolve these platinum-alkenylsiloxane complexes in an alkenylsiloxane oligomer such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, or 1,3,5,7-tetramethyl-1,3,5,7-tetravinylcyclotetrasiloxane or an organosiloxane oligomer such as a dimethylsiloxane oligomer, and it is particularly preferable to dissolve the complexes in an alkenylsiloxane oligomer.

The content of component (E) is a catalytic quantity. Specifically, the content is preferably an amount such that the catalyst metal atoms in component (E) are within the range of from 0.01 to 500 ppm in terms of mass units with respect to the present composition, more preferably within the range of from 0.01 to 100 ppm, and particularly preferably within the range of from 0.1 to 50 ppm. This is because the discoloration of the cured product can be suppressed when the content of component (E) is within the range described above. This is also because the resulting composition can be sufficiently cured when the content of component (E) is greater than or equal to the lower limit of the range described above, and the discoloration of the resulting cured product can be suppressed when the content is less than or equal to the upper limit of the range described above.

The present composition may also comprise (F) a hydrosilylation reaction inhibitor as an optional component for extending the usable time at room temperature and improving the storage stability. Examples of such component (F) include alkyne alcohols such as 1-ethynylcyclohexan-1-ol, 2-methyl-3-butyn-2-ol, 3,5-dimethyl-1-hexyn-3-ol, and 2-phenyl-3-butyn-2-ol; en-yne compounds such as 3-methyl-3-penten-1-yne and 3,5-dimethyl-3-hexen-1-yne; methylalkenylsiloxane oligomers such as 1,3,5,7-tetramethyl-1,3,5,7-tetravinylcyclotetrasiloxane and 1,3,5,7-tetramethyl-1,3,5,7-tetrahexenylcyclotetrasiloxane; alkynoxysilanes such as dimethyl bis-(3-methyl-1-butyn-3-oxy) silane and methylvinyl bis-(3-methyl-1-butyn-3-oxy)silane, and triallylisocyanurate compounds.

The content of component (F) is not particularly limited but is an amount sufficient to suppress gelling or to suppress curing at the time of the mixing of components (A) to (D) and is an amount sufficient to enable long-term storage. Specifically, the content of component (F) is preferably within the range of from 0.0001 to 5 parts by mass and more preferably within the range of from 0.01 to 3 parts by mass per 100 parts by mass of the total mass of components (A) to (D). This is because a sufficient pot life can be secured when the content of component (F) is greater than or equal to the lower limit of the range described above, and smooth curing can be achieved by heating when the content is less than or equal to the upper limit of the range described above.

In addition, the present composition may also comprise (G) an adhesion promoter in order to further improve adhesion to the substrate with which the composition makes contact during curing. Such component (G) is preferably an organic silicon compound having 1 or 2 or more silicon-bonded alkoxy groups in a molecule. Examples of the alkoxy groups include methoxy groups, ethoxy groups, propoxy groups, butoxy groups, and methoxyethoxy groups, and methoxy groups or ethoxy groups are particularly preferable. Examples of groups other than alkoxy groups bonding with the silicon atoms of this organic silicon compound include substituted or unsubstituted monovalent hydrocarbon groups such as alkyl groups, alkenyl groups, aryl groups, aralkyl groups, and halogenated alkyl groups; epoxy group-containing monovalent organic groups such as glycidoxyalkyl groups (such as 3-glycidoxypropyl groups, 4-glycidoxybutyl groups, and the like), epoxycyclohexylalkyl groups (such as 2-(3,4-epoxycyclohexyl)ethyl groups, 3-(3,4-epoxycyclohexyl)propyl groups, and the like), and oxiranylalkyl groups (such as 4-oxiranylbutyl groups, 8-oxiranyloctyl groups, and the like); acrylic group-containing monovalent organic groups such as 3-methacryloxypropyl groups; isocyanate groups; isocyanurate groups; and hydrogen atoms. The organic silicon compound preferably has a group that can react with the aliphatic unsaturated hydrocarbon groups or silicon-bonded hydrogen atoms in the present composition. Specifically, the organic silicon compound preferably has silicon-bonded aliphatic unsaturated hydrocarbon groups or silicon-bonded hydrogen atoms.

The content of component (G) is not particularly limited but is preferably within the range of from 0.01 to 10 parts by mass and more preferably within the range of from 0.1 to 3 parts by mass per 100 parts by mass of the total mass of components (A) to (D). This is because the adhesion is favorable when the content of component (G) is greater than or equal to the lower limit of the range described above, and the storage stability is favorable when the content is less than or equal to the upper limit of the range described above.

The present composition may also comprise (H) a phosphor as another optional component. Examples of such component (H) include yellow, red, green, and blue light-emitting phosphors consisting of oxide phosphors, oxynitride phosphors, nitride phosphors, sulfide phosphors, oxysulfide phosphors, or the like, which are widely used in light-emitting diodes (LEDs), for example. Examples of oxide phosphors include yttrium, aluminum, and garnet-type YAG green to yellow light-emitting phosphors containing cerium ions; terbium, aluminum, and garnet-type TAG yellow light-emitting phosphors containing cerium ions; and silicate green to yellow light-emitting phosphors containing cerium or europium ions. Examples of oxynitride phosphors include silicon, aluminum, oxygen, and nitrogen-type sailon red to green light-emitting phosphors containing europium ions. Examples of nitride phosphors include calcium, strontium, aluminum, silicon, and nitrogen-type cousin red light-emitting phosphors containing europium ions. Examples of sulfide phosphors include ZnS green light-emitting phosphors containing copper ions or aluminum ions. Examples of oxysulfide phosphors include $Y_2O_2S$ red light-emitting phosphors containing europium ions. One type or a mixture of two or more types of these phosphors may be used.

The particle size of component (H) is not particularly limited but is preferably within the range of from 1 to 50 µm and more preferably within the range of from 5 to 20 µm. This is because increases in viscosity at the time of mixing are suppressed when the particle size of component (H) is greater than or equal to the lower limit of the range described above, and the optical transmittance is favorable when the particle size is less than or equal to the upper limit of the range described above.

The content of component (H) is not particularly limited but is within the range of from 0.1 to 70% by mass with respect to the total mass of the present composition. The content is preferably not more than 70% by mass from the perspective of handling workability and is preferably at least 5% by mass when taking into consideration white photoconversion.

The present composition may also comprise 1 or 2 or more types of inorganic fillers selected from silica, glass, alumina, and the like; silicone rubber powders; resin powders such as silicone resins and polymethacrylate resins; and 1 or 2 or more types of components selected from heat resistant agents, dyes, pigments, flame retardants, solvents, and the like as other optional components, as long as the object of the present invention is not undermined.

Although the curing of the present composition progresses when left to stand at room temperature or when heated, it is preferable to heat composition in order to cure the composition quickly. The heating temperature is preferably within the range of from 50 to 200° C.

The present composition preferably forms a cured product with a type A durometer hardness from 30 to 99 and particularly preferably from 35 to 95 as prescribed by JIS K 6253 when cured. This is because the composition has sufficient strength and is sufficiently protective when the hardness of the cured product of the curable silicone composition is greater than or equal to the lower limit of the range described above, and the cured product is flexible and sufficiently durable when the hardness is less than or equal to the upper limit of the range described above.

In addition, the present composition preferably forms a cured product with an optical transmittance of at least 90% at 450 nm when cured. This optical transmittance can be found, for example, by measuring the optical transmittance (25° C.) of the cured product with a spectrophotometer at a light path length of 0.1 cm and a wavelength of 450 nm.

The present composition preferably forms a cured product with a value of b* of not more than 2.0 and particularly preferably not more than 1.0 in the CIE L*a*b* color system prescribed by JIS Z8730 before or after heating for 500 hours at 240° C. The value of b* of the cured product of the present composition in the CIE L*a*b* color system prescribed by JIS Z8730 can be measured using a colorimeter, for example.

[Cured Product]

Next, the cured product of the present invention will be described in detail.

The cured product of the present invention is formed by curing the curable silicone composition described above. The cured product of the present invention preferably has characteristics as described above. The cured product of the present invention may be a sheet- or film-like cured product or a cured product which covers a transparent substrate such as a glass substrate. Further, the cured product of the present invention may be in the form of a lens, a light pipe, a light guide, or a remote phosphor component. Methods of forming a cured product include compression molding, transfer molding, injection molding, and deposition onto a transparent substrate. The curable silicone composition described above can be mixed using a mixing device such as a static mixer or a screw mixer and then injected into a molding device and molded. The molding conditions are not particularly limited, but the curable silicone composition can be cured for 30 seconds to 30 minutes and preferably for 1 to 10 minutes at a temperature of from 50° C. to 200° C. and preferably from 70° C. to 180° C. Post curing (secondary curing) can also be performed at 50° C. to 200° C. and preferably 70° C. to 180° C. for approximately 0.1 to 10 hours and preferably approximately 1 to 4 hours.

When the cured product of the present invention contains a phosphor, the cured product can be used as a remote phosphor or a phosphor sheet in an LED or an illumination device. A remote phosphor is a cured product containing a phosphor which is used to obtain a white color or a lightbulb color from blue light emitted from an LED chip at a distance from the LED chip or an LED device. The remote phosphor is used to diffuse light with high directivity emitted from the LED chip. A cross-sectional view of an LED in which a cured product of the present invention containing a phosphor is used as a remote phosphor is illustrated in FIG. 5. In the LED illustrated in FIG. 5, an optical semiconductor element 1 is die-bonded to a lead frame 2, and the optical semiconductor element 1 and a lead frame 3 are wire-bonded with a bonding wire 4. This optical semiconductor element 1 may be sealed by a cured product 6 of the curable silicone composition described above. A light reflection material 5 is formed on the periphery of the optical semiconductor element 1, and a cured product 7 of the curable silicone composition described above containing a phosphor is provided as a remote phosphor with spacing on top of the semiconductor element 1 of the light reflection material 5.

Further, a cross-sectional view of an illumination device in which a cured product of the present invention containing a phosphor is used as a remote phosphor is illustrated in FIG. 6. In the illumination device illustrated in FIG. 6, the optical semiconductor element 1 is die-bonded to a substrate 8 and electrically connected to a circuit (not illustrated) on the substrate. This optical semiconductor element 1 may be sealed by the cured product 6 of the curable silicone composition described above. A light reflection material 5 is formed on the periphery of the substrate 8 having a plurality of these optical semiconductor elements 1, and a cured product 7 of the curable silicone composition described above containing a phosphor is provided as a remote phosphor with spacing on top of the semiconductor elements 1 of the light reflection material 5. Examples of the substrate 8 include metals with high conductivity such as silver, gold, and copper; metals with low conductivity such as aluminum and nickel; thermoplastic resins into which white pigments are mixed such as PPA and LCP; thermosetting resins containing white pigments such as epoxy resins, BT resins, polyimide resins, and silicone resins; and ceramics such as alumina and alumina nitride.

When the cured product of the present invention does not contain a phosphor, the cured product can be used as a lens material.

[Optical Semiconductor Device]

The optical semiconductor device of the present invention will now be described in detail.

The optical semiconductor device of the present invention is characterized in that an optical semiconductor element is sealed, covered, or adhered by the composition described above. Specific examples of the optical semiconductor element include light-emitting diodes (LEDs), semiconductor lasers, photodiodes, phototransistors, solid-state image sensing devices, and light emitters and receivers for photocoupler, and the optical semiconductor element is preferably a light-emitting diode (LED).

Since light emission occurs from the top, bottom, left, and right sides of the semiconductor in a light-emitting diode (LED), it is not preferable for the parts constituting the light-emitting diode (LED) to absorb light, and a material with high optical transmittance or high reflectivity is preferable. Therefore, it is also preferable for the substrate on which the optical semiconductor element is mounted to be a material with high optical transmittance or high reflectivity. Examples of the substrate on which the optical semiconductor element is mounted include metals with high conductivity such as silver, gold, and copper; metals with low conductivity such as aluminum and nickel; thermoplastic resins into which white pigments are mixed such as PPA and LCP; thermosetting resins containing white pigments such as epoxy resins, BT resins, polyimide resins, and silicone resins; and ceramics such as alumina and alumina nitride. The curable silicone composition has favorable thermal shock resistance with respect to the optical semiconductor element and the substrate, and the resulting optical semiconductor device can demonstrate good reliability.

Cross-sectional views of surface-mounted LEDs serving as examples of the optical semiconductor device of the present invention are illustrated in FIGS. 1 to 4. In the LED illustrated in FIG. 1, an optical semiconductor element 1 is die-bonded to a lead frame 2, and this optical semiconductor element 1 and a lead frame 3 are wire-bonded with a bonding wire 4. A light reflection material 5 is formed on the periphery of this optical semiconductor element 1, and the optical semiconductor element 1 inside the light reflection material 5 is sealed by a cured product 6 of the curable silicone composition described above.

In the LED illustrated in FIG. 2, an optical semiconductor element 1 is sealed by a cured product 7 of the curable silicone composition described above containing a phosphor. In the LED illustrated in FIG. 3, an optical semiconductor element 1 is sealed by a cured product 7 of the curable silicone composition described above containing a phosphor, and the surface of the cured product 7 is further sealed by a cured product 6 of the curable silicone composition described above. In the LED illustrated in FIG. 4, an optical semiconductor element 1 is sealed by a cured product 6 of the curable silicone composition described above, and the surface of the cured product 6 is further sealed by a cured product 7 of the curable silicone composition described above containing a phosphor.

An example of a method for producing the surface-mounted LED illustrated in FIG. 1 is a method of die-bonding the optical semiconductor element 1 to the lead frame 2, wire-bonding the optical semiconductor element 1 and the lead frame 3 with a bonding wire 4 made of gold, molding the curable silicone composition by transfer molding or compression molding, and then forming the light reflection material 5 on the periphery of the optical semiconductor element 1. Another example is a method of first forming the light reflection material 5 and then resin-sealing the optical semiconductor element 1 on the inside of the light reflection material 5 with the curable silicone composition described above.

Yet another example of a LED using phosphor is illustrated in FIG. 7, wherein the cured product 7 containing phosphor fills the volume around the optical semiconductor element 1 and is placed between two white reflection materials 5.

EXAMPLES

The curable silicone composition, cured product, and optical semiconductor device of the present invention will be described in detail hereinafter using Practical Examples and Comparative Examples. The characteristics of the cured product of the curable silicone composition were measured as follows.

[Changes in Hardness]

After the curable silicone composition was press-molded for 10 minutes at 150° C., the composition was post-cured for 3 hours at 150° C. so as to prepare a sheet-like cured product with a thickness of 2 mm. The hardness when three of these sheet-like cured products were layered was measured with a type A durometer as prescribed by JIS K 6253. After a sheet-like cured product prepared in the same manner as described above was thermally aged for 500 hours in an oven at 240° C., the hardness was measured in the same manner as described above.

[Changes in Transmittance and CIE b*]

After the transmittance of a disposable liquid cell containing purified water was measured and defined as 100% transmittance, a sheet-like cured product with a thickness of 2 mm cut into short strips was placed in the liquid cell, and the transmittance (%) was measured. A Konica Minolta colorimeter CM-5 was used for measurements, and the transmittance at 450 nm when irradiated with D65 reference light and the value of b* in the CIE L*a*b* color system prescribed by JIS Z8730 were measured with a photoelectric colorimeter. In addition, after a sheet-like cured product prepared in the same manner as described above was thermally aged for 500 hours in an oven at 240° C., the transmittance (%) and the value of b* in the CIE L*a*b* color system were measured in the same manner as described above.

[Changes in CIE u' and v']

The values of u' and v' in the 1976 CIE u' v' color space of the cured product with the shape indicated in FIG. 7 were measured with a spectrophotometer, using a blue LED with a 450 nm peak as the pump source. This shape is described in more detail in US Patent Application Publication No. 2011/0215707 A1 (FIGS. 1 and 2) which is incorporated herein as a reference. In addition, after the cured parts were thermally aged for 18 hours in an oven at 200° C., the values of u' and v' in the CIE u' v' color space were measured in the same manner as described above. A total of 20 parts (ten prepared according to Practical Example 12 and ten controls prepared according to Comparative Example 5) was measured. The color shift over time was calculated for each part according to the formula:

$$\Delta u'v' = [(u'-u'_0)^2 + (v'-v'_0)^2]^{1/2},$$

where $u'_0$ and $v'_0$ are the initial values of u' and v', correspondingly.

The averaged results are shown in Table 3 and demonstrate a decrease in average color change upon thermal treatment for the samples made according to this invention. They also indicate an improved luminous flux maintenance for the practical example over the comparative one.

[Changes in Elongation]

A sheet-like cured product with a thickness of 2 mm was prepared, and this was stamped out in the form of JIS No. 3. The elongation (%) at break was measured using an autograph made by Shimadzu Corporation. In addition, after a sheet-like cured product prepared in the same manner as described above was thermally aged for 500 hours in an oven at 240° C., the elongation (%) was measured in the same manner as described above.

[Changes in Adhesive Strength]

An uncured silicone composition was dripped onto a float glass to a size of 8 mm ϕ, and a 10 mm square aluminum segment was placed on top of the composition. This was cured for 1 hour at 150° C. while applying constant pressure to prepare an adhesion test sample. After cooling at room temperature, the adhesive strength (N/cm$^2$) when a sheering force was applied from the lateral direction using an SS-30WD bond tester made by Seishin was measured. In addition, after an adhesion test sample prepared in the same manner as described above was thermally aged for 500 hours in an oven at 240° C., the adhesive strength (N/cm$^2$) was measured in the same manner as described above.

[Rate of Change in Volume]

The mass and density of a cured product with a thickness of 2 mm were measured using a D-H100 automatic densimeter made by Toyo Seiki Seisaku-Sho, Ltd., and the volume was calculated from these data. Next, after this cured product was thermally aged for 500 hours in an oven at 240° C., the volume was measured in the same manner as described above, and the rate of change in volume (%) after heat resistance tests with respect to the initial volume was expressed.

[Average Burn Rate]

Flammability tests were performed following the procedure of Underwater's Laboratory Bulletin 94 entitled "Test for Flammability of Plastic Materials, UL94", which is incorporated herein by reference. Horizontal burn rates (mm/min) were obtained according to Horizontal Burning Test for Classifying Materials 94HB on 15 samples per group (following the sample dimensions prescribed by the test) for Practical Examples 13 to 15 and Comparative Example 6. Each average burn rate of the cured product was calculated and listed in Table 4.

[LED Device Reliability Tests]

A cerium silanolate compound was added to obtain the compounded amounts shown in Table 2. A light-emitting chip with a main luminescence center peak of 470 nm was mounted with a die attaching material on a case housing material made of polyphthalamide having a silver-plated lead frame. Curable silicone compositions prepared in Practical Example 8 and Comparative Example 3 were injected as a sealing agent into a case of an LED device to which a lead electrode and a light-emitting chip were connected with gold wire, and these were cured by heating for 4 hours at 150° C. to prepare an optical semiconductor device. The LED device was made to emit light by applying 700 mA to this optical semiconductor device under conditions with a temperature of 85° C., and the initial radiant flux (mW) and the radiant flux (mW) after 300 hours of light emission were measured.

Practical Examples 1 to 15 and Comparative Examples 1 to 6

The following components were uniformly mixed according to the compositions (parts by mass) shown in Tables 1 and 2 to prepare the curable silicone compositions of Practical Examples 1 to 11 and Comparative Examples 1 to 4. In Tables 1 and 2, SiH/Vi indicates the total number of moles of silicon-bonded hydrogen atoms in component (C) with respect to 1 mole of the total vinyl groups in components (A) and (B) in the curable silicone composition.

The following components were used as component (A). The viscosity was the value at 25° C. and was measured using a type B viscometer in accordance with JIS 1(7117-1.

Component (A-1): Dimethylpolysiloxane capped at both molecular terminals with dimethylvinylsiloxy groups, which has a viscosity of 360 mPa·s (vinyl group content=0.44% by mass)

Component (A-2): Dimethylpolysiloxane capped at both molecular terminals with dimethylvinylsiloxy groups, which has a viscosity of 11,000 mPa·s (vinyl group content=0.14% by mass)

Component (A-3): Dimethylpolysiloxane capped at both molecular terminals with dimethylvinylsiloxy groups, which has a viscosity of 40,000 mPa·s (vinyl group content=0.08% by mass)

The following components were used as component (B). The weight average molecular weight was expressed as the molecular weight in terms of standard polystyrene measured using a gel permeation chromatograph.

Component (B-1): Organopolysiloxane represented by the following average unit formula and having a weight average molecular weight of approximately 20,000 (vinyl group content: 3.2% by mass):

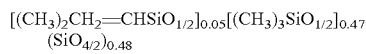

$[(CH_3)_2CH_2=CHSiO_{1/2}]_{0.05}[(CH_3)_3SiO_{1/2}]_{0.47}(SiO_{4/2})_{0.48}$

Component (B-2): Organopolysiloxane represented by the following average unit formula and having a weight average molecular weight of approximately 5,500 (vinyl group content: 3.4% by mass):

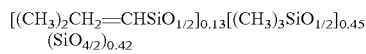

$[(CH_3)_2CH_2=CHSiO_{1/2}]_{0.13}[(CH_3)_3SiO_{1/2}]_{0.45}(SiO_{4/2})_{0.42}$

Component (B-3): Organopolysiloxane represented by the following average unit formula and having a weight average molecular weight of approximately 20,000 (vinyl group content: 4.2% by mass):

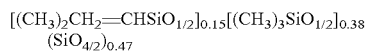

$[(CH_3)_2CH_2=CHSiO_{1/2}]_{0.15}[(CH_3)_3SiO_{1/2}]_{0.38}(SiO_{4/2})_{0.47}$

The following components were used as component (C). The viscosity was the value at 25° C. and was measured using an Ubbelohde viscometer in accordance with JIS Z8803.

Component (C-1): Organopolysiloxane represented by the following average unit formula and having a kinetic viscosity of 18 mm²/s (content of silicon-bonded hydrogen atoms: approximately 0.97% by mass):

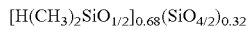

$[H(CH_3)_2SiO_{1/2}]_{0.68}(SiO_{4/2})_{0.32}$

Component (C-2): Methylhydrogenpolysiloxane capped at both molecular terminals with trimethylsiloxy groups with a kinetic viscosity of 5 mm²/s (content of silicon-bonded hydrogen atoms: approximately 1.4% by mass)

The following component was used as component (D).

Component (D-1): Dimethylpolysiloxane with cerium content of 1.4% by mass

The following component was used as component (E).

Component (E-1): 1,3-divinyltetramethyl disiloxane solution of platinum-1,3-divinyltetramethyl disiloxane complex (platinum metal content: approximately 6,800 ppm)

Component (E-2): 8% by mass of 1,3-divinyltetramethyl disiloxane solution of platinum-1,3-divinyltetramethyl disiloxane complex in dimethylvinylsiloxy terminated, dimethylpolysiloxane (platinum metal content: approximately 5,200 ppm)

The following component was used as component (F).

Component (F-1): 1-ethynylcyclohexan-1-ol

Component (F-2): 3,5-dimethyl-1-hexyn-3-ol

The following component was used as component (G).

Component (G-1): 3-glycidoxypropyltrimethoxysilane

The following component was used as component (H).

Component (H-1): YAG phosphor with a median particle size of 9 μm (product name: BYW01A made by Phosphor Tech Co.)

Component (H-2): YAG phosphor with a median particle size of 11 μm (product name: NYAG-4156L made by Intematix Co.)

Component (H-3): Red nitride phosphor with a median particle size of 17 μm (product name: ER-6535 made by Intematix Co.)

TABLE 1

| | | Category Examples | | | |
|---|---|---|---|---|---|
| Item | | Practical Example 1 | Practical Example 2 | Practical Example 3 | Practical Example 4 |
| Curable silicone composition (parts by mass) | Component (A-1) | 0 | 0 | 0 | 0 |
| | Component (A-2) | 66 | 66 | 66 | 66 |
| | Component (A-3) | 0 | 0 | 0 | 0 |
| | Component (B-1) | 0 | 0 | 0 | 0 |
| | Component (B-2) | 0 | 0 | 0 | 0 |
| | Component (B-3) | 34 | 34 | 34 | 34 |
| | Component (C-1) | 3.9 | 3.9 | 3.9 | 3.9 |
| | Component (C-2) | 2.7 | 2.7 | 2.7 | 2.7 |
| | Component (D-1) | 0.19 | 0.34 | 0.49 | 1.00 |
| | Component (E-1) | 0.071 | 0.071 | 0.071 | 0.071 |
| | Component (F-1) | 0.016 | 0.016 | 0.016 | 0.016 |
| | Component (G-1) | 0.5 | 0.5 | 0.5 | 0.5 |
| SiH/Vi | | 1.3 | 1.3 | 1.3 | 1.3 |
| Transmittance (%) | Initial | 99 | 99 | 98 | 98 |
| | After heat resistance tests | 98 | 97 | 97 | 96 |
| b* | Initial | 0.3 | 0.3 | 0.4 | 0.6 |
| | After heat resistance tests | 0.7 | 0.9 | 0.9 | 1.5 |

TABLE 1-continued

| | | | | | |
|---|---|---|---|---|---|
| Hardness | Initial | 82 | 82 | 82 | 80 |
| | After heat resistance tests | 81 | 80 | 79 | 76 |
| Adhesive strength (N/cm²) | Initial | 666 | 785 | 645 | 543 |
| | After heat resistance tests | 331 | 263 | 228 | 233 |
| Rate of change in volume (%) | | −8 | −7 | −7 | −6 |
| Elongation (%) | Initial | 53 | 51 | 52 | 54 |
| | After heat resistance tests | 10 | 16 | 20 | 27 |

| | | Category Examples | | | |
|---|---|---|---|---|---|
| Item | | Practical Example 5 | Practical Example 6 | Practical Example 7 | Practical Example 8 |
| Curable silicone composition (parts by mass) | Component (A-1) | 0 | 0 | 0 | 0 |
| | Component (A-2) | 66 | 66 | 0 | 0 |
| | Component (A-3) | 0 | 0 | 81 | 81 |
| | Component (B-1) | 0 | 0 | 19 | 19 |
| | Component (B-2) | 0 | 0 | 0 | 0 |
| | Component (B-3) | 34 | 34 | 0 | 0 |
| | Component (C-1) | 3.9 | 3.9 | 3.1 | 3.1 |
| | Component (C-2) | 2.7 | 2.7 | 0 | 0 |
| | Component (D-1) | 4.00 | 8.20 | 0.50 | 1.00 |
| | Component (E-1) | 0.071 | 0.071 | 0.039 | 0.039 |
| | Component (F-1) | 0.016 | 0.016 | 0.200 | 0.200 |
| | Component (G-1) | 0.5 | 0.5 | 0 | 0 |
| SiH/Vi | | 1.2 | 1.2 | 1.2 | 1.2 |
| Transmittance (%) | Initial | 96 | 92 | 98 | 98 |
| | After heat resistance tests | 94 | 90 | 94 | 93 |
| b* | Initial | 2.8 | 5.8 | 0.3 | 0.5 |
| | After heat resistance tests | 6.5 | 10.2 | 0.9 | 1.1 |
| Hardness | Initial | 78 | 75 | 52 | 50 |
| | After heat resistance tests | 75 | 73 | 39 | 38 |
| Adhesive strength (N/cm²) | Initial | 511 | 483 | — | — |
| | After heat resistance tests | 228 | 197 | — | — |
| Rate of change in volume (%) | | −4 | −4 | −6 | −4 |
| Elongation (%) | Initial | 56 | 54 | 320 | 325 |
| | After heat resistance tests | 31 | 35 | 100 | 170 |

| | | Category | | |
|---|---|---|---|---|
| | | Examples | Comparative Examples | |
| Item | | Practical Example 9 | Comparative Example 1 | Comparative Example 2 |
| Curable silicone composition (parts by mass) | Component (A-1) | 40 | 0 | 0 |
| | Component (A-2) | 0 | 66 | 66 |
| | Component (A-3) | 0 | 0 | 0 |
| | Component (B-1) | 0 | 0 | 0 |
| | Component (B-2) | 60 | 0 | 0 |
| | Component (B-3) | 0 | 34 | 34 |
| | Component (C-1) | 3.6 | 3.9 | 3.9 |
| | Component (C-2) | 2.5 | 2.7 | 2.7 |
| | Component (D-1) | 0.50 | 0 | 0.10 |
| | Component (E-1) | 0.047 | 0.072 | 0.071 |
| | Component (F-1) | 0.020 | 0.016 | 0.016 |
| | Component (G-1) | 0.3 | 0.5 | 0.5 |
| SiH/Vi | | 0.8 | 1.3 | 1.3 |

TABLE 1-continued

| | | | | |
|---|---|---|---|---|
| Transmittance (%) | Initial | 98 | 98 | 99 |
| | After heat resistance tests | 93 | Measurements could not be taken due to cracks. | |
| b* | Initial | 0.4 | 0.2 | 0.2 |
| | After heat resistance tests | 0.8 | 0.6 | 0.5 |
| Hardness | Initial | 88 | 81 | 82 |
| | After heat resistance tests | 86 | Measurements could not be taken due to cracks. | |
| Adhesive strength (N/cm²) | Initial | 586 | 467 | 528 |
| | After heat resistance tests | 243 | Measurements could not be taken due to cracks. | |
| | Rate of change in volume (%) | −6 | Measurements could not be taken due to cracks. | |
| Elongation (%) | Initial | 20 | 53 | 54 |
| | After heat resistance tests | 8 | Measurements could not be taken due to cracks. | |

TABLE 2

| | | Category | | | |
|---|---|---|---|---|---|
| | | Examples | | Comparative Examples | |
| | Item | Practical Example 10 | Practical Example 11 | Comparative Example 3 | Comparative Example 4 |
| Curable silicone composition (parts by mass) | Component (A-2) | 66 | 66 | 66 | 66 |
| | Component (B-3) | 34 | 34 | 34 | 34 |
| | Component (C-2) | 5.4 | 5.4 | 5.4 | 5.4 |
| | Component (D-1) | 0.49 | 0.49 | 0 | 0 |
| | Component (E-1) | 0.071 | 0.071 | 0.072 | 0.071 |
| | Component (F-1) | 0.016 | 0.016 | 0.016 | 0.016 |
| | Component (G-1) | 0.5 | 0.5 | 0.5 | 0.5 |
| | Component (H-1) | 0 | 45 | 0 | 45 |
| | SiH/Vi | 1.3 | 1.3 | 1.3 | 1.3 |
| Hardness | Initial | 70 | 83 | 70 | 83 |
| | After heat resistance tests | 70 | 84 | Measurements could not be taken due to cracks. | 95* |
| LED device reliability tests | Initial | 194 | 171 | 194 | 173 |
| | After 300 hours | 166 | 162 | No light emitted | 122 |

*In Comparative Example 4, the cured product after heat resistance tests did not develop cracks due to the filler reinforcing effect of the phosphor, but a dramatic increase in hardness was observed.

As can be seen from the results of Tables 1 and 2, the cured products of the curable silicone compositions of Practical Examples 1 to 11 did not develop cracks due to thermal aging. Moreover, the cured products of the curable silicone compositions of Practical Examples 10 and 11 demonstrated excellent light emission in reliability tests performed on the LED device after 300 hours.

Practical Examples 12 to 15 and Comparative Examples 5 and 6

The above components were uniformly mixed according to the compositions (parts by mass) shown in Tables 3 and 4 to prepare the curable silicone compositions of Practical Examples 12 to 15 and Comparative Examples 5 and 6. In Tables 3 and 4, SiH/Vi indicates the total number of moles of silicon-bonded hydrogen atoms in component (C) with respect to 1 mole of the total vinyl groups in components (A) and (B) in the curable silicone composition.

TABLE 3

| | | Category | |
|---|---|---|---|
| | Item | Practical Example 12 | Comparative Example 5 |
| Curable silicone composition (parts by mass) | Component (A-3) | 67.94 | 68.20 |
| | Component (B-1) | 26.42 | 26.52 |
| | Component (C-1) | 3.02 | 3.03 |
| | Component (D-1) | 0.37 | 0.00 |
| | Component (E-2) | 0.06 | 0.06 |
| | Component (F-2) | 0.20 | 0.20 |
| | Component (H-2) | 1.800 | 1.800 |
| | Component (H-3) | 0.200 | 0.200 |
| | SiH/Vi | 1.4 | 1.4 |
| 1976 CIE u' | Initial | 0.2648 | 0.2659 |
| | After heat resistance test | 0.2647 | 0.2655 |
| 1976 CIE v' | Initial | 0.5380 | 0.5390 |
| | After heat resistance test | 0.5379 | 0.5386 |
| Δ u'v' (Color Shift Over Time) | | 0.0006 | 0.0010 |
| Luminous Flux Maintenance (% of initial lm value for each example) | | 96.3 | 93.5 |

TABLE 4

| | | Category | | | |
|---|---|---|---|---|---|
| | | Examples | | | Comparative Example |
| Item | | Practical Example 13 | Practical Example 14 | Practical Example 15 | Comparative Example 6 |
| Curable silicone composition (parts by mass) | Component (A-3) | 69.33 | 69.07 | 68.56 | 69.59 |
| | Component (B-1) | 26.96 | 26.86 | 26.66 | 27.06 |
| | Component (C-1) | 3.08 | 3.07 | 3.04 | 3.09 |
| | Component (D-1) | 0.374 | 0.744 | 1.478 | 0 |
| | Component (E-2) | 0.06 | 0.06 | 0.06 | 0.06 |
| | Component (F-2) | 0.199 | 0.199 | 0.197 | 0.20 |
| SiH/Vi | | 1.4 | 1.4 | 1.4 | 1.4 |
| Average Burn Rate (mm/min.) | | 67 | 48 | 45 | 79 |

INDUSTRIAL APPLICABILITY

The curable silicone composition of the present invention does not develop cracks due to thermal aging and can form a cured product with little yellow discoloration. The curable silicone composition is therefore suitable as a sealing agent, a coating, or an adhesive for an optical semiconductor element of an optical semiconductor device. Furthermore, the curable silicone composition is suitable as a material for producing a lens, a light pipe, a light guide, or a remote phosphor component.

REFERENCE NUMERALS

1 Optical semiconductor element
2 Lead frame
3 Lead frame
4 Bonding wire
5 Light reflection material
6 Cured product of a curable silicone composition not containing a phosphor
7 Cured product of a curable silicone composition containing a phosphor
8 Substrate

The invention claimed is:

1. A curable silicone composition comprising:
(A) a straight-chain organopolysiloxane having at least two alkenyl groups in a molecule;
(B) an organopolysiloxane represented by the following average unit formula:

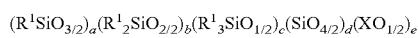

$(R^1SiO_{3/2})_a(R^1{}_2SiO_{2/2})_b(R^1{}_3SiO_{1/2})_c(SiO_{4/2})_d(XO_{1/2})_e$ wherein, $R^1$ each independently represent an alkyl group having from 1 to 12 carbon atoms, an alkenyl group having from 2 to 12 carbon atoms, an aryl group having from 6 to 20 carbon atoms, an aralkyl group having from 7 to 20 carbon atoms, or a group in which some or all of hydrogen atoms of these groups are substituted with halogen atoms, with the proviso that at least two $R^1$ in a molecule are the alkenyl groups, X is a hydrogen atom or an alkyl group, a is a number from 0 to 0.3, b is 0 or a positive number, c is a positive number, d is a positive number, e is a number from 0 to 0.4, a+b+c+d=1, c/d is a number from 0 to 10, and b/d is a number from 0 to 0.5, in an amount such that the mass ratio of component (A) to component (B) is from 1/99 to 99/1;
(C) an organopolysiloxane having at least two silicon-bonded hydrogen atoms in a molecule, in an amount such that the amount of silicon-bonded hydrogen atoms in this component is from 0.1 to 10 moles per 1 mol of the total alkenyl groups in components (A) and (B);
(D) a cerium-containing organopolysiloxane, in an amount such that the amount of cerium atoms in component (D) is from 25 to 67 ppm in terms of mass units with respect to the total mass of the composition; and
(E) a catalytic quantity of a hydrosilylation reaction catalyst.

2. The curable silicone composition according to claim 1, wherein, in component (B), 0.1 to 40 mol % of all $R^1$ are alkenyl groups having from 2 to 12 carbon atoms, and at least 10 mol % of all $R^1$ are alkyl groups having from 1 to 12 carbon atoms.

3. The curable silicone composition according to claim 1, wherein component (B) is an organopolysiloxane comprising: $R^1(CH_3)_2SiO_{1/2}$ units (wherein, $R^1$ is an alkyl group having from 1 to 12 carbon atoms, an alkenyl group having from 2 to 12 carbon atoms, an aryl group having from 6 to 20 carbon atoms, an aralkyl group having from 7 to 20 carbon atoms, or a group in which some or all of the hydrogen atoms of these groups are replaced with halogen atoms, with the provision that at least two $R^1$ in a molecule are the alkenyl groups) and $SiO_{4/2}$ units.

4. The curable silicone composition according to claim 1, further comprising (F) a hydrosilylation reaction inhibitor in an amount equal to 0.01 to 3 parts by mass per 100 parts by mass of the total mass of components (A) to (D).

5. The curable silicone composition according to claim 1, further comprising (G) an adhesion promoter in an amount equal to 0.1 to 3 parts by mass per 100 parts by mass of the total mass of components (A) to (D).

6. The curable silicone composition according to claim 1, further comprising (H) a phosphor in an amount equal to 0.1 to 70% by mass with respect to the total mass of the composition.

7. The curable silicone composition according to claim 1, the curable silicone composition forming a cured product with an optical transmittance at 450 nm of at least 90%.

8. The curable silicone composition according to claim 1, the curable silicone composition forming a cured product with a value of b* of not more than 2.0 in the CIE L*a*b* color system prescribed by JIS Z8730 before or after heating for 500 hours at 240° C.

9. The curable silicone composition according to claim 1, for sealing, covering, or adhering an optical semiconductor element in an optical semiconductor device.

10. A cured product, obtained by curing the curable silicone composition according to claim 1.

11. The cured product according to claim 10, wherein the cured product is in the form of a lens, a light pipe, a light guide, or a remote phosphor component.

12. An optical semiconductor device, formed by sealing, covering, or adhering an optical semiconductor element in the semiconductor device with the curable silicone composition according to claim 1.

13. The optical semiconductor device according to claim 12, wherein the optical semiconductor device is a light emitting diode.

14. The optical semiconductor device according to claim 12, wherein the curable silicone composition contains at least one phosphor.

15. The optical semiconductor device according to claim 12, wherein the color shift over time is reduced.

16. The optical semiconductor device according to claim 12, wherein the luminous flux maintenance over time is improved.

17. The cured product according to claim 10, wherein the flammability of the cured product is reduced.

* * * * *